United States Patent
Kato et al.

(10) Patent No.: US 7,216,044 B2
(45) Date of Patent: May 8, 2007

(54) BATTERY STATE DIAGNOSING DEVICE AND BATTERY STATE DIAGNOSING METHOD

(75) Inventors: Yoshitsugu Kato, Osaka (JP); Hirohito Funato, Utsunomiya (JP); Alexandru Forrai, Amagasaki (JP)

(73) Assignee: ESPEC Corporation, Osaka (JP)

( * ) Notice: Subject to any disclaimer, the term of this patent is extended or adjusted under 35 U.S.C. 154(b) by 135 days.

(21) Appl. No.: 10/649,612

(22) Filed: Aug. 28, 2003

(65) Prior Publication Data
US 2004/0158418 A1    Aug. 12, 2004

(30) Foreign Application Priority Data
Feb. 7, 2003    (JP)    ............... 2003-031572

(51) Int. Cl.
*G01R 31/36* (2006.01)
(52) U.S. Cl. .................................. 702/63
(58) Field of Classification Search ............... 702/63, 702/108, 81, 182, 183; 340/1, 2, 636.1–636.21; 320/120–165
See application file for complete search history.

(56) References Cited

U.S. PATENT DOCUMENTS

| | | | | |
|---|---|---|---|---|
| 5,444,378 A * | 8/1995 | Rogers | ...................... | 324/428 |
| 6,011,379 A * | 1/2000 | Singh et al. | ................ | 320/132 |
| 6,076,964 A * | 6/2000 | Wu et al. | ................... | 374/141 |
| 6,118,275 A * | 9/2000 | Yoon et al. | ................ | 324/427 |
| 6,160,382 A * | 12/2000 | Yoon et al. | ................ | 320/136 |
| 6,242,873 B1 * | 6/2001 | Drozdz et al. | ............. | 318/139 |
| 6,262,563 B1 * | 7/2001 | Champlin | ................... | 320/134 |
| 6,441,586 B1 * | 8/2002 | Tate et al. | ................... | 320/132 |
| 2002/0130637 A1 * | 9/2002 | Schoch | ...................... | 320/132 |
| 2002/0182465 A1 * | 12/2002 | Okamoto | .................... | 429/24 |
| 2003/0184307 A1 * | 10/2003 | Kozlowski et al. | ........ | 324/427 |

FOREIGN PATENT DOCUMENTS

| | | | |
|---|---|---|---|
| JP | 6-337282/1994 | | 12/1994 |
| JP | 10-232273 | * | 9/1998 |
| JP | 10-232273/1998 | | 9/1998 |

\* cited by examiner

*Primary Examiner*—Bryan Bui
*Assistant Examiner*—Demetrius Pretlow
(74) *Attorney, Agent, or Firm*—Nixon & Vanderhye P.C.

(57) ABSTRACT

A battery state diagnosing device applies load to a battery from a load applying section, measures input and output characteristics of the battery, and diagnoses a state of the battery by plugging a result of measurement into a mathematical expression obtained by a system identification method. In the battery state diagnosing device, a current load is used as the load applying section. With this arrangement, the battery state diagnosing device is capable of suitably determining, for example, life and state-of-charge of the battery.

14 Claims, 12 Drawing Sheets

INPUT CURRENT SIGNAL

OUTPUT VOLTAGE SIGNAL

BATTERY STATE DIAGNOSING DEVICE AND BATTERY STATE DIAGNOSING METHOD

FIELD OF THE INVENTION

The present invention relates to a device and a method for carrying out performance evaluation, malfunction diagnosis, trouble diagnosis, deterioration prediction, a pre-shipment test, and a defective/non-defective judgment for fuel cells including a proton-exchange membrane fuel cell (hereinafter PEFC) and a direct methanol fuel cell (hereinafter DMFC) in particular, or for secondary batteries including a nickel-cadmium battery, a lithium-ion battery, and a nickel-hydrogen battery in particular.

BACKGROUND OF THE INVENTION

Fuel cells such as PEFC and DMFC are still under development, and there has been no established method for testing, evaluating, and diagnosing these fuel cells. At present, therefore, an alternate current impedance or output voltage-output current characteristics of a fuel cell are measured by activating the battery by a fuel/oxidizer gas supply control device. The fuel cell is shipped after it is confirmed that the measured alternate current impedance or output voltage-output current characteristics satisfy development and product specifications.

Especially, there has been no method for performing a life test and deterioration prediction of the battery other than actually operating the battery for its lifetime according to the product specification, because factors that accelerate deterioration of battery is still unknown.

Consequently, it requires a considerable amount of time to confirm life or deterioration of fuel cell operation. For example, in order to test fuel cell life by means of sampling, it is necessary to drive the battery for its lifetime according to the product specification.

In order to find the life of fuel cell operation, it is necessary to measure its impedance and output voltage-output current characteristics at predetermined intervals. It requires considerable ingenuity to make use of the measured impedance and output voltage-output current characteristics in judging life or other properties of the fuel cell, because changes in these static characteristics are expected to be very small. Accordingly, it will become easier to judge the life of the fuel cell if its dynamic characteristics can be used for the judgment.

The following describes a method for testing, evaluating, and diagnosing a secondary battery, referring, as examples, to FIG. 13(a), which illustrates manufacturing steps for a lithium-ion battery, and FIG. 13(b), which illustrates steps of charging and discharging the battery in the manufacturing steps.

The manufacturing process for a lithium-ion battery are roughly divided into (1) an electrode mixing step, (2) a binding step, (3) an injection step, (4) a post-assembling step, (5) a charging and discharging step, and (6) a pre-shipment test step.

In the charging and discharging step (5), as shown in FIG. 13(b), includes the following procedures: [1] impedance measurement; [2] voltage measurement; [3] charging; [4] discharging; [5] capacitance ranking; [6] charging; [7] a self-discharge test; and [8] pre-shipment charging and discharging.

In the charging and discharging step, the steps [3], [4], [6], and [7] take a long time. In step [3], it takes three hours to fully charge the battery. In the step [4], it takes an hour to completely discharge the battery. At present, it is impossible to shorten the time required for these steps, because a full charge state of the battery cannot be simulated, for example, by half charging it.

Although not shown in FIG. 13(b), the properties of the battery are sometimes measured after charging and discharging the battery once, and then repeating charging and discharging a hundred times, so as to confirm reliability of the battery before shipment. In this case, the charging and discharging step takes at least 400 hours.

In view of the above problems, attempts have been made to shorten the time required for testing and diagnosing a battery by diagnosing a state of the battery according to a system identification theory. Examples of such attempts are disclosed in Japanese Publication for Unexamined Patent Application No. 232273/1998 (Tokukaihei 10-232273; publication date: Sep. 2, 1998), Japanese Publication for Unexamined Patent Application No. 337282/1994 (Tokukaihei 6-337282; publication date: Dec. 6, 1994), and the like.

For example, Tokukaihei 10-232273 discloses a method for determining remaining amount of electricity in a battery by applying an alternate current signal to the battery to be analyzed, estimating a transfer function of the battery from a result of sampling alternating voltage and alternating current, and calculating an extreme value of the transfer function.

However, according to the method of Tokukaihei 10-232273, in a device for measuring alternating voltage and alternating current of the battery, a voltage source noise (voltage load) with a serial load of an impedance element are serially connected to the battery. This is not an optimal method for extracting battery characteristics because an error of the impedance element directly affects the measurement.

Specifically, in Tokukaihei 10-232273, in obtaining the transfer function of the battery, an impedance is identified by including a series impedance (i.e. transfer function G(s), which is determined from the measured alternating voltage and alternate current, is expressed as a sum of transfer function $H_B(s)$ of the battery and transfer function $H_f(s)$ of the impedance element.)

Accordingly, in order to obtain an actual impedance of the battery, it is necessary to subtract the external impedance from the measured impedance. In Tokukaihei 10-232273, resistance and pure capacitance are used as the impedance element. The resistor causes a problem when there is a temperature change, and the capacitance, by nature, has a large margin of error. Therefore, the errors directly affect accuracy of identification. If measurement is to be performed by directly connecting the voltage source to the battery without using the impedance element, a current value becomes excessively large, and it becomes difficult to control the current.

There is also a subordinate problem that it is necessary to switch between the resistor and the capacitor.

SUMMARY OF THE INVENTION

It is therefore an object of the present invention to provide a battery state diagnosing device and a battery state diagnosing method that are capable of suitably determining life, state-of-charge, and the like of a battery by system identification.

To attain the above object, a battery state diagnosing device of the present invention is a battery state diagnosing device for applying load to a battery, measuring input and output characteristics of the battery, and diagnosing a state of the battery by plugging a result of measurement into a mathematical expression obtained by a system identification method, the battery state diagnosing device applying load to the battery using a current load.

In the battery state diagnosing device for diagnosing a battery state by the system identification method, it is necessary to measure the terminal voltage and current of the battery so as to identify the internal impedance of the battery. In a conventional arrangement where a voltage load is used for the measurement, an impedance element is serially connected to the battery because the battery in this case is an internal equivalent circuit including an electromotive force and a low series impedance. Therefore, the measured current or a mathematical expression representing it includes a load voltage due to the impedance element, in addition to the load impedance. This causes the problem of direct current path, whereby the load voltage needs to be finely adjusted in accordance with changes in internal electromotive force of the battery in order to adjust the current to a predetermined value.

In contrast, according to the arrangement above, the problem of direct current path is avoided, making it easier to identify the internal impedance of the battery from the measured current. This is achieved by applying current load to the battery, so that the load voltage and load impedance do not appear in the measured current or a mathematical expression representing the measured current.

To attain the above object, another battery state diagnosing device of the present invention is a battery state diagnosing device for applying a current to a battery, measuring input and output characteristics of the battery, and diagnosing a state of the battery by plugging a result of measurement into a mathematical expression obtained by a system identification method, the battery being a fuel cell that is not supplied with fuel, and the battery being supplied with current from a voltage source.

With this arrangement, in applying the system identification method employed in the battery state diagnosing device to a fuel cell such as PEFC, DMFC, or the like, deterioration of an electrolyte can be diagnosed by performing the system identification without activating the fuel cell. Specifically, the foregoing method can be used to measure deterioration of the battery even when the fuel cell behaves differently when fuel is supplied thereto and when fuel is not supplied thereto, because, even when no fuel is supplied, only the electromotive force is absent and the electrolyte and the impedance of an electrode can still be measured.

In the diagnosis of a fuel cell that is not supplied with fuel, as described above, the problem of direct current path does not occur even if a voltage source is used, because in this case no electromotive force is generated in the fuel cell. Therefore, for a fuel cell that is not supplied with fuel, it is preferable to make diagnosis using a voltage source, which is easier to realize.

To attain the above object, yet another battery state diagnosing device of the present invention is a battery state diagnosing device for applying load to a battery, measuring input and output characteristics of the battery, and diagnosing a state of the battery by plugging a result of measurement into a mathematical expression obtained by a system identification method, said battery state diagnosing device including: a circuit section for constituting a closed circuit by serially connecting the battery to a current load when diagnosing the battery; a measuring section, connected to the circuit section, for measuring a terminal voltage of the battery and a current flowing in the circuit section; and a diagnosing section for diagnosing, by the system identification method, a state of the battery based on a result of measurement by the measuring section.

In this arrangement, the measuring section measures the terminal voltage and current of the battery while the current load is connected to the battery in the circuit section. In this way, the load voltage and load impedance do not appear in the measured current or a mathematical expression representing the measured current. As a result, the problem of direct current path is avoided, making it easier to identify the internal impedance of the battery from the measured current.

To attain the above object, still another battery state diagnosing device of the present invention is a battery state diagnosing device for applying a current to a battery, measuring input and output characteristics of the battery, and diagnosing a state of the battery by plugging a result of measurement into a mathematical expression obtained by a system identification method, the battery being a fuel cell that is not supplied with fuel, said battery state diagnosing device including: a circuit section for constituting a closed circuit by serially connecting the battery to a voltage source when diagnosing the battery; a measuring section, connected to the circuit section, for measuring a terminal voltage of the battery and a current flowing in the circuit section; and a diagnosing section for diagnosing, by the system identification method, a state of the battery based on a result of measurement by the measuring section.

In this arrangement, the measuring section measures the terminal voltage and current of the battery while the current load is connected to the battery in the circuit section. Here, when the battery is a fuel cell that is not supplied with fuel, the use of voltage source to apply current to the battery does not cause the problem of direct current path because in this case no electromotive force is generated in the fuel cell. Therefore, for a fuel cell that is not supplied with fuel, it is preferable to make diagnosis using a voltage source, which is easier to realize.

For a fuller understanding of the nature and advantages of the invention, reference should be made to the ensuing detailed description taken in conjunction with the accompanying drawings.

DESCRIPTION OF THE EMBODIMENTS

With reference to the drawings, the following describes an embodiment of the present invention.

The present invention provides a device and a method for expeditiously performing deterioration prediction, performance evaluation, a defective/non-defective judgment, and a pre-shipment test of a battery (secondary battery) or a fuel cell (PEFC or DMFC), using a system identification method.

Figure 1:
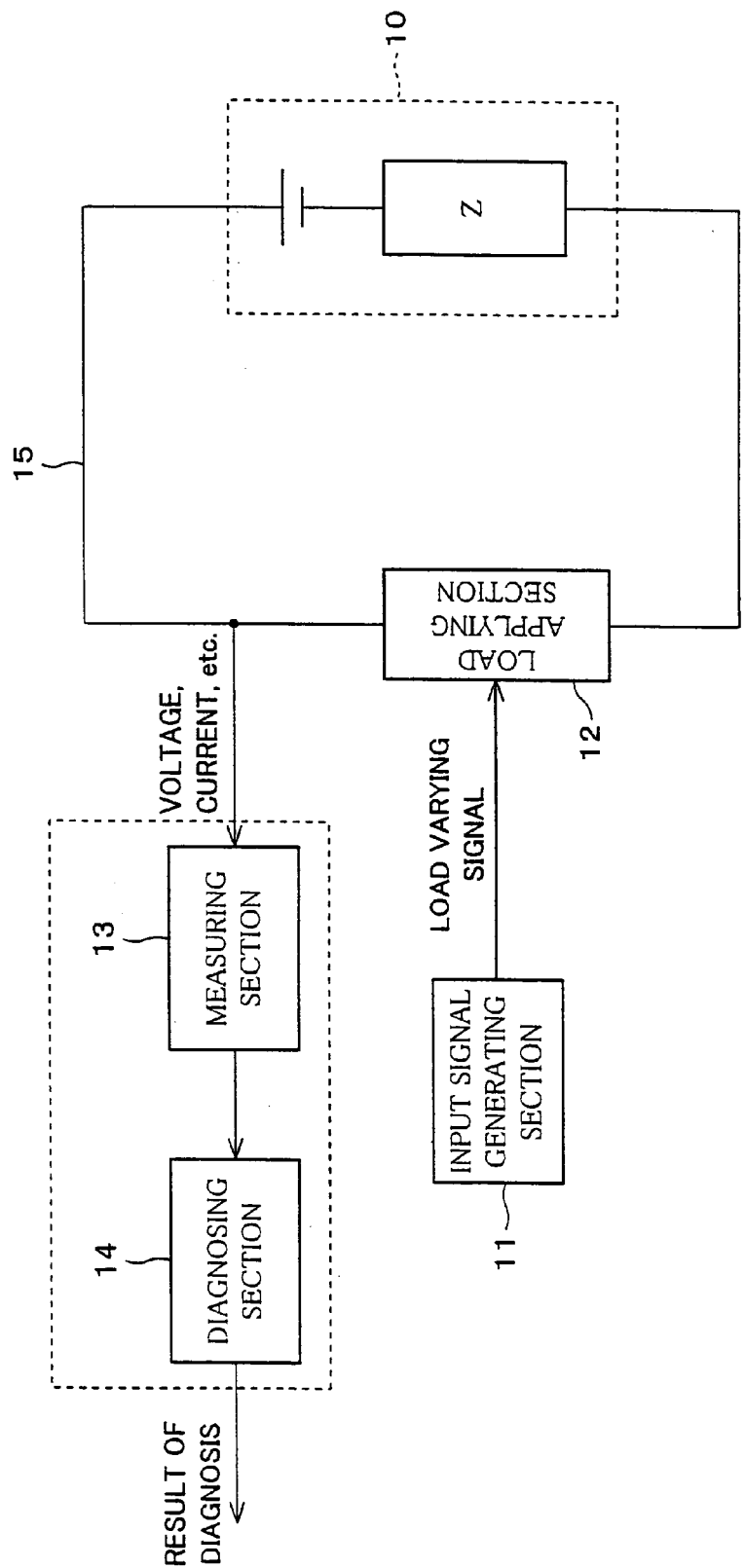
FIG. 1 is a block diagram illustrating a schematic structure of a battery state diagnosing device of one embodiment of the present invention.

First, described below with reference to FIG. 1 is a schematic arrangement of a battery state diagnosing device of the present embodiment. As shown in FIG. 1, the battery state diagnosing device includes an input signal generating section 11, a load applying section 12, a measuring section 13, and a diagnosing section 14. The battery state diagnosing device measures a voltage and a current generated in a battery 10 while applying a load thereto, and diagnoses a state of the battery 10 based on the measured voltage and current.

The input signal generating section 11 and the load applying section 12 are means for applying a load to the battery 10. The load applying section 12 is a current load. By using the current load as the load applying section 12, it is possible, in a closed circuit 15 in which the battery 10 is installed, to cut a current value of a direct current generated by the internal electromotive force of the battery 10 to zero, so as to avoid an influence of the direct current. Therefore, the problem of the direct current path as in Tokukaihei 10-232273 does not occur in the battery state diagnosing device.

The measuring section 13 is means for measuring the voltage and current generated in the battery 10 under applied current load. The diagnosing section 14 diagnoses, by the system identification method, the state of the battery 10 in accordance with the voltage and current measured by the measuring section 13.

Figure 2:
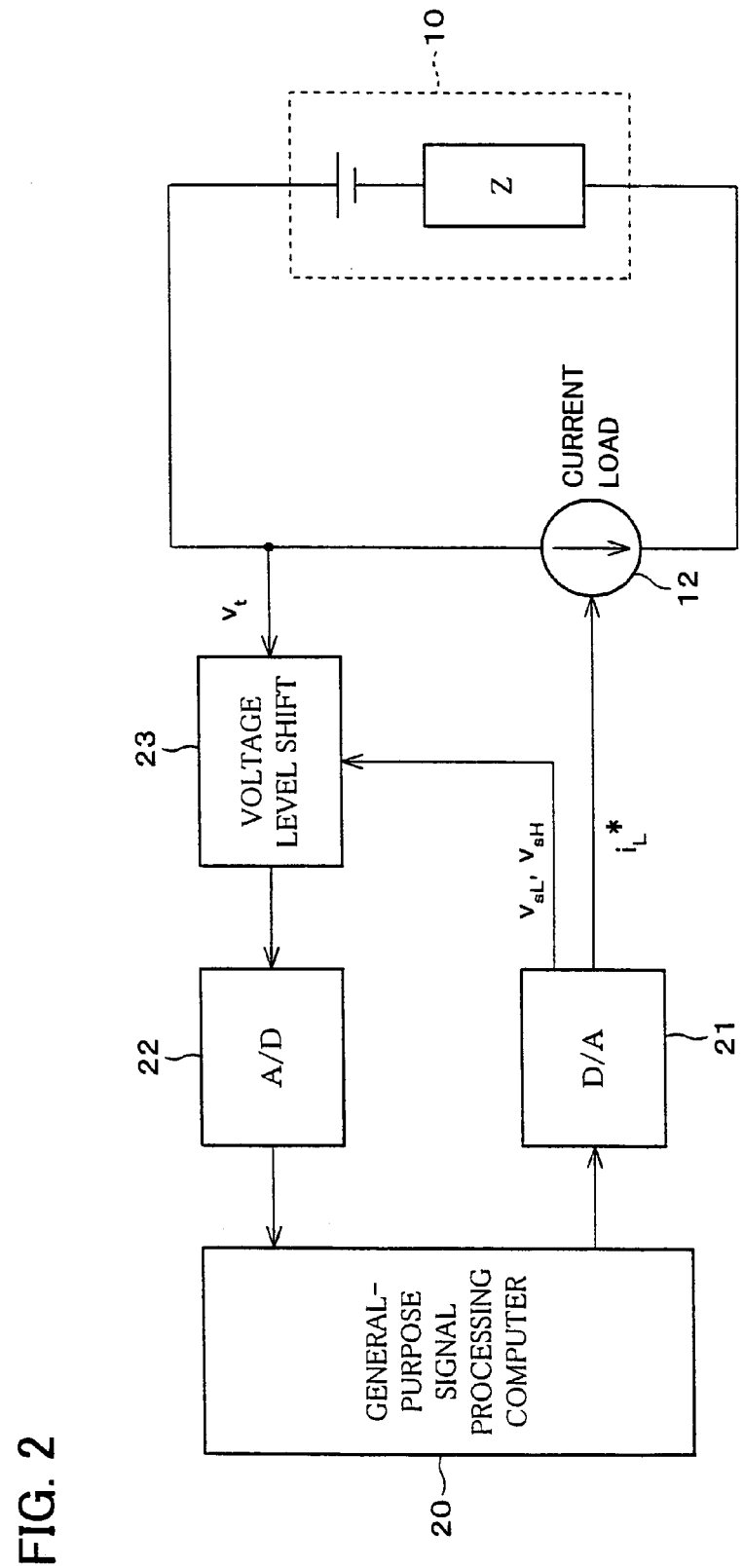
FIG. 2 is a block diagram illustrating a more detailed structure of the battery state diagnosing device.

A specific circuit structure of the battery state diagnosing device is shown in FIG. 2. The input signal generating section 11, the measuring section 13, and the diagnosing section 14 are realized by a general-purpose signal processing computer 20. Accordingly, by mass-producing the battery state diagnosing device, it is possible to easily lower manufacturing costs therefor.

It is preferable that a load current supplied to the battery 10 by the load applying section 12 is a white noise. However, due to the difficulty in realizing this, a PRBS (Pseudo-Random Binary Signal), for example an M-sequence signal, whose spectrum is sufficient for performing system identification, is used. By a function of the input signal generating section 11 performed by the general-purpose signal processing computer 20, the PRBS is generated according to the following equation:

$$v(t) = a_1 v(t-1) + a_2 v(t-2) + \ldots + a_n v(t-n).$$

In this equation, a period is $N = 2^{n-1} - 1$. Under certain conditions, it is also possible to perform the diagnosis by using a square-wave current, which has a narrow spectrum, as the load current.

Figure 3:
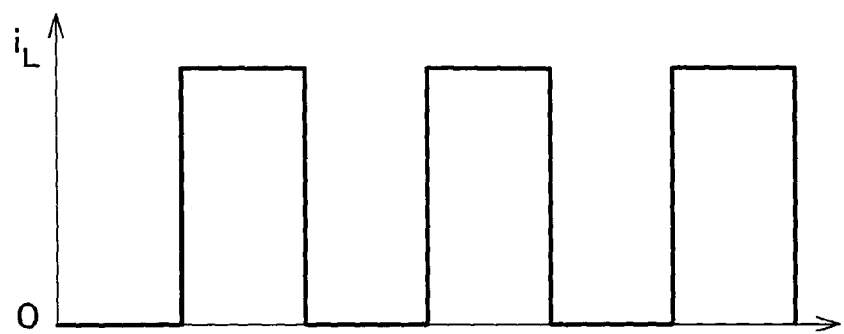
FIGS. 3(*a*) and 3(*b*) are wave form charts illustrating input and output responses of a battery diagnosed by the battery state diagnosing device.
Figure 3:
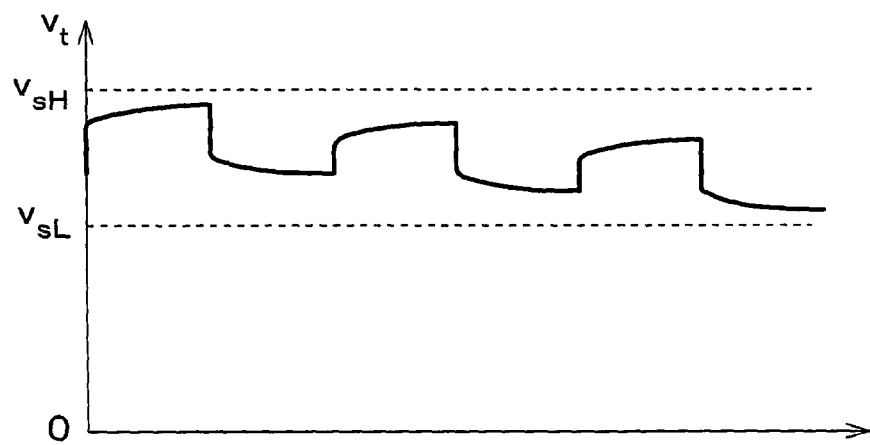

The PRBS is supplied to the load applying section 12 via a D/A converter 21, drives the load applying section 12, and generates a current $i_L$ having a rectangular wave form as shown in FIG. 3(a). In other words, the load applying section 12 controls the current flowing in the closed circuit 15 into which the battery 10 is installed, so that the current value becomes $i_L$.

Figure 11:
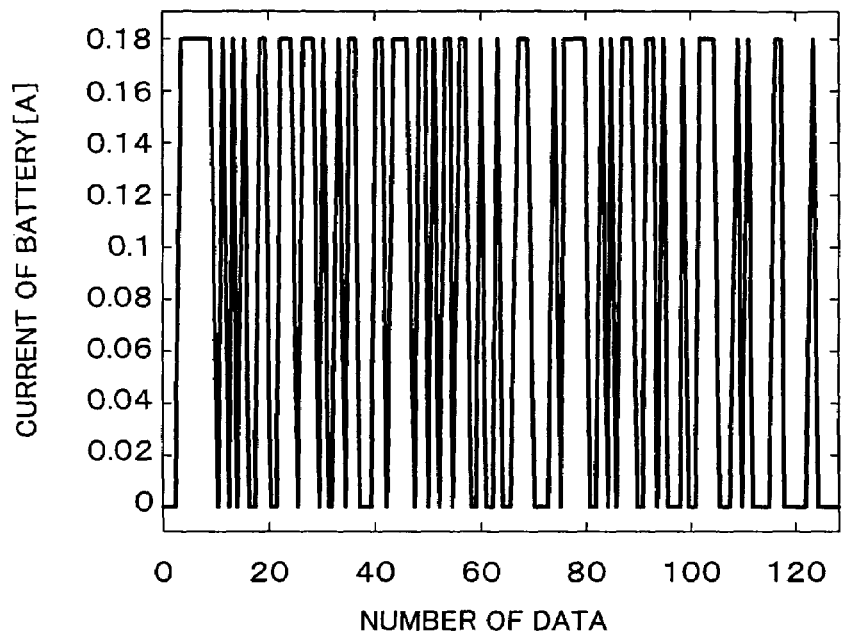
FIGS. 11(a) and 11(b) are wave form charts showing examples of wave forms when diagnosis is being performed.
Figure 11:
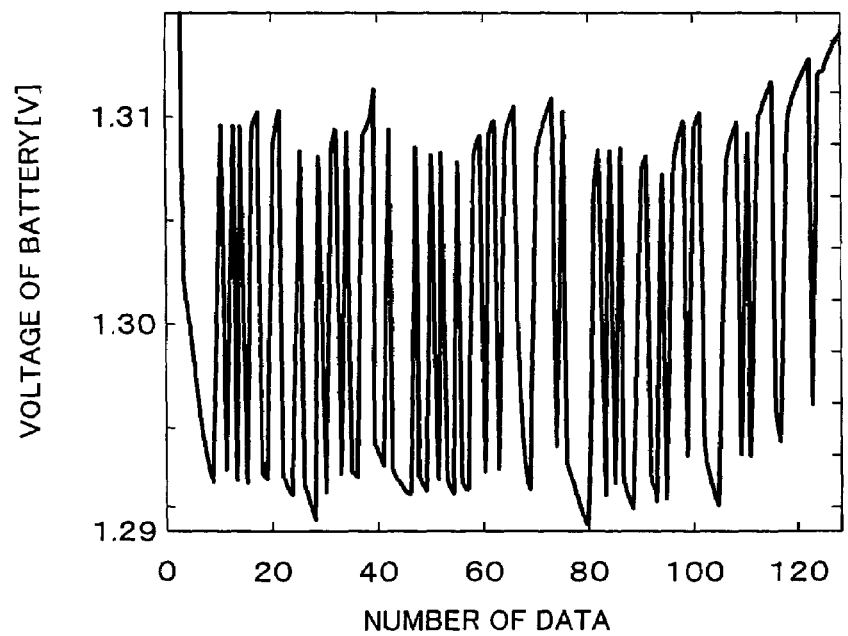

With the rectangular wave form as shown in FIG. 3(a), the current $i_L$ causes the voltage and electromotive force to decrease due to an internal resistance of the battery 10, thereby causing a terminal voltage $v_t$ of the battery 10 to fluctuate as shown in FIG. 3(b). The measuring section 13 measures the terminal voltage $v_t$. That is, in the present battery state diagnosing device employing the system identification method, the load current $i_L$ is an input, and the battery terminal voltage $V_t$ is an output. FIGS. 11(a) and 11(b) show examples of wave forms of the input current signal and the output voltage signal measured by the measuring section 13.

Figure 4:
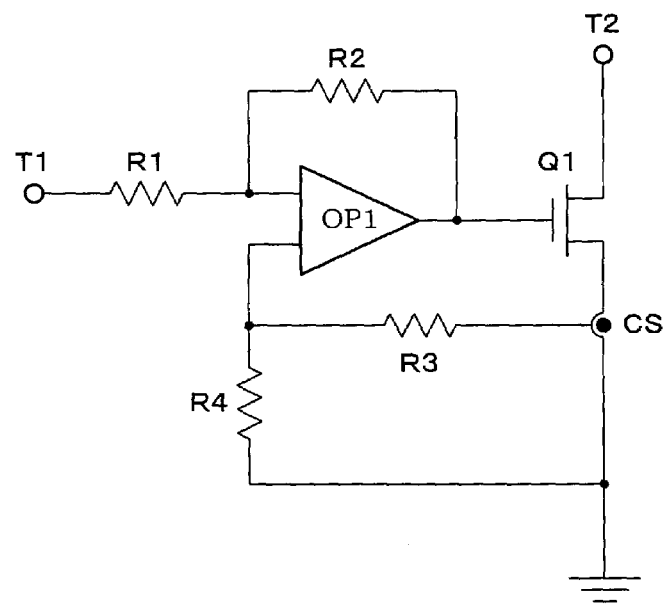
FIG. 4 is a circuit diagram illustrating a structure of a current load in the battery state diagnosing device.

In the battery 10, a response of the battery terminal voltage $v_t$ with respect to the input load current $i_L$ is given by a time constant of generally approximately several hundreds of milliseconds. Accordingly, the load applying section 12 can be realized by a relatively simple load circuit, as shown in FIG. 4.

The load circuit feeds back the current detected by a hall element current sensor CS to an error amplifier including an operational amplifier OP1 and resistors R1 to R4, so as to control the current $i_L$ (supplied from a terminal T2) flowing in the closed circuit 15 to be identical to a current command $i_L$ (supplied from a terminal T1) from the signal processing computer 20.

In the load circuit, a steady-state error caused by a gain of the error amplifier occurs in the current detected by the hall element current sensor CS. However, the steady-state error can be calculated in advance. This makes it possible to set a value for the current command $i_L$ by taking into account the steady-state error. The load circuit may be installed in a designated measuring device. Alternatively, the load circuit may be conveniently realized using a part of a circuit in a device to which the battery is to be connected.

Figure 5:
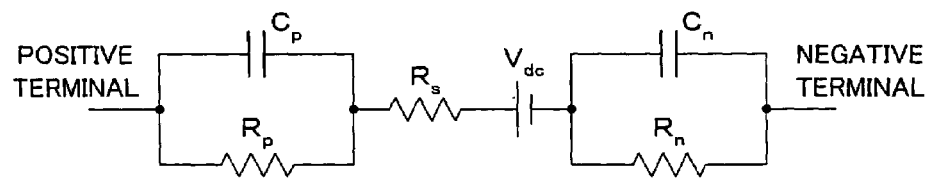
FIG. 5 is a circuit diagram illustrating an equivalent circuit of the battery.

Although there are several ways to express an equivalent circuit of a battery, the battery of the present embodiment is approximated by a circuit shown in FIG. 5. Here, Cp and Rp are equivalent circuits of a positive terminal, Rs is an equivalent circuit of an electrolyte, and Cn and Rn are equivalent circuits of a negative terminal. Indicated by $V_{dc}$ is the internal electromotive force of the battery. As long as the system identification method is employed, it is not necessary to consider an electrochemical state inside the battery.

Assuming such an equivalent circuit in the battery 10, a response of the voltage $v_t$ to the current load $i_L$ of a rectangular wave as shown in FIG. 3(a) assumes the pattern as shown in FIG. 3(b). Here, the impedance Z of the equivalent circuit can be given by the following equation:

$$Z = Rs + \frac{b_1 s + b_0}{s^2 + a_1 s + a_0}$$

where

-continued $$a_1 = \frac{C_p R_p + C_n R_n}{C_p C_n R_p R_n}, a_0 = \frac{1}{C_p C_n R_p R_n}, b_1 = b_0 = \frac{C_p + C_n}{C_p C_n}$$

s: Laplace transformer

Figure 6:
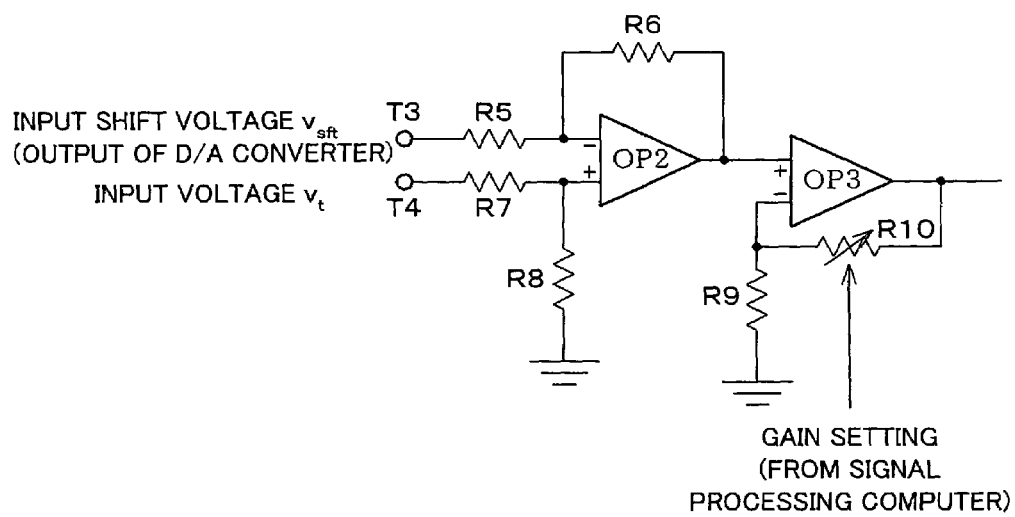
FIG. 6 is a circuit diagram illustrating a structure of voltage level shift means in the battery state diagnosing device.

Here, the voltage $v_t$ measured in the battery state diagnosing device fluctuates within a range of at most approximately several hundred millivolts with respect to $V_{dc}$, which is the electromotive force of the battery. The resolution of the measuring section 13 will accordingly decrease if the voltage $v_t$ is directly supplied to an A/D converter 22, and via the A/D converter 22 to the general-purpose signal processing computer 20 realizing the measuring section 13 (see FIGS. 1 and 2). In order to overcome this drawback, a voltage level shift means 23 is used. As the voltage level shift means 23, a voltage signal processing circuit as shown in FIG. 6 is used.

The voltage signal processing circuit converts an input voltage (that is, $v_t$), ranging from $V_{sL}$ to $V_{sH}$, into a rated input voltage (shift voltage) $v_{sft}$ (for example, −10V to +10V) of the A/D converter 22. In the voltage signal processing circuit, the range of $v_{sL}$ to $v_{sH}$ may be changed by setting the shift voltage $v_{sft}$ and the gain. The shift voltage $v_{sft}$ and the gain may be set by the signal processing computer 20.

The battery state diagnosing device of the present embodiment employs the system identification method. Here, the system identification is to create a mathematical model for a dynamic system based on measured data. The mathematical model is, by necessity, expressed by mathematical expressions. A process of creating the mathematical model and mathematical expressions expressing the mathematical model is as follows. The following descriptions are given with reference to System identification for control using MATLAB, Shuichi ADACHI, (Tokyo Denki University Press), pp. 55 to 58.

The mathematical model and mathematical expressions are created with respect to a group of products (group A) having representative operating capacities. Assuming that an input of the mathematical model is u(k), and an output thereof is y(k), a mathematical expression expressing the mathematical model can be given by Equation (1) below $$y(k)+a_1 y(k-1)+a_2 y(k-2)+ \ldots +a_n y(k-n)=b_1 u_1(k-1)+b_2 u_2(k-2)+ \ldots +b_m u_m(k-m) \quad (1)$$

In Equation (1), the input u(k) and output y(k) are regarded as time-series data (discrete time data). In determining a relationship between (function for) the input u(k) and output y(k), only finite numbers of the input u(k) and output y(k) are taken into consideration. In addition, Equation (1) relates to an average model that represents an average behavior of the group of products (A). In Equation (1), k is the number of past time-series data.

In Equation (1), a vector $a=(a_1, a_2, \ldots, a_n)$, and a vector $b=(b_1, b_2, \ldots, b_m)$. The vectors a and b are determined by a commonly used method of determining a regression vector using the least-squares method. Further, the electromotive force $v_{av}$, electromotive force changing rate $v_{dt}$, and series resistance $R_s$ are determined from measured voltage data, so as to obtain a vector $c=(v_{av}, v_{dt}, R_s)$. How to obtain the $v_{av}$, $v_{dt}$, and $R_s$ of the vector c will be described later.

Then, the same input signal supplied to the group of products (A) is supplied to a product (B), which is different from the group of products (A), and an output from the product (B) is measured, so as to obtain an equation specific to the product (B). The equation specific to the product (B) is as follows:

$$y(k)+a_{1B}y(k-1)+a_{2B}y(k-2)+ \ldots +a_{nB}y(k-n)=b_{1B}u_1(k-1)+b_{2B}u_2(k-2)+ \ldots +b_{mB}u_m(k-m) \quad (2)$$

In Equation (2), a vector $a_B=(a_{1B}, a_{2B}, \ldots, a_{nB})$, and a vector $b_B=(b_{1B}, b_{2B}, \ldots, b_{mB})$. Further, by the method used to obtain the vector c, a vector $C_B=(v_{av}, v_{dt}, R_s)$ is obtained.

The vectors a, b, c and vectors $a_B$, $b_B$, $c_B$ so obtained can be compared with each other by term-to-term comparison. From the differences, it is possible to judge deterioration tendency, remaining life, defective/non-defective state, and a test result of the battery.

For example, if there is correlation between the vectors a, b and c, and the vectors $a_n$, $b_n$ and $c_n$ (the vectors a, b and c represent a full charge state of a secondary battery; the vectors $a_n$, $b_n$ and $c_n$ represent a ¹⁄₁₀ charge state of the secondary battery), a full charge performance of a product not included in a parent population can be estimated by obtaining vectors $a_m$, $b_m$, and $c_m$ that represent a state of products not included in the parent population.

Moreover, by comparing general tendencies (e.g. whether coefficients are generally large or small) of the vectors a, b and c, and the vectors $a_B$, $b_B$ and $c_B$, it is possible to estimate a future state and future performance (performance after deterioration) of the product.

Taking the pre-shipment test as an example, a test result can be easily obtained by using a general-purpose signal processing computer, such as a DSP (Digital Signal Processor) currently available, by supplying to the battery the input signal that was used for the system identification, and measuring an output from the battery, when a good product is assumed to be product m whose coefficients am, bm, and cm in its equation satisfy the following conditions:

$$\left.\begin{array}{l} a_1 - 3\sigma_{a1} < a_{1m} < a_1 + 3\sigma_{a1} \\ \vdots \\ a_n - 3\sigma_{an} < a_{nm} < a_n + 3\sigma_{an} \\ b_1 - 3\sigma_{b1} < b_{1m} < b_1 + 3\sigma_{b1} \\ \vdots \\ b_m - 3\sigma_{b1} < b_{mm} < b_m + 3\sigma_{bm} \\ v_{av} - 3\sigma_{vav} < v_{avm} < v_{av} + 3\sigma_{vav} \\ v_{dt} - 3\sigma_{vdt} < v_{dtm} < v_{dt} + 3\sigma_{vdt} \\ R_s - 3\sigma_{rs} < R_s < R_s + 3\sigma_{rs} \end{array}\right\} \quad (3)$$

In Equation (3), σ is a standard deviation, and Equation (3) merely represents an example in which good products lie in the interval of approximately ±3σ. Therefore, the foregoing criterion is subject to change depending on a battery state or other factors.

Figure 7:
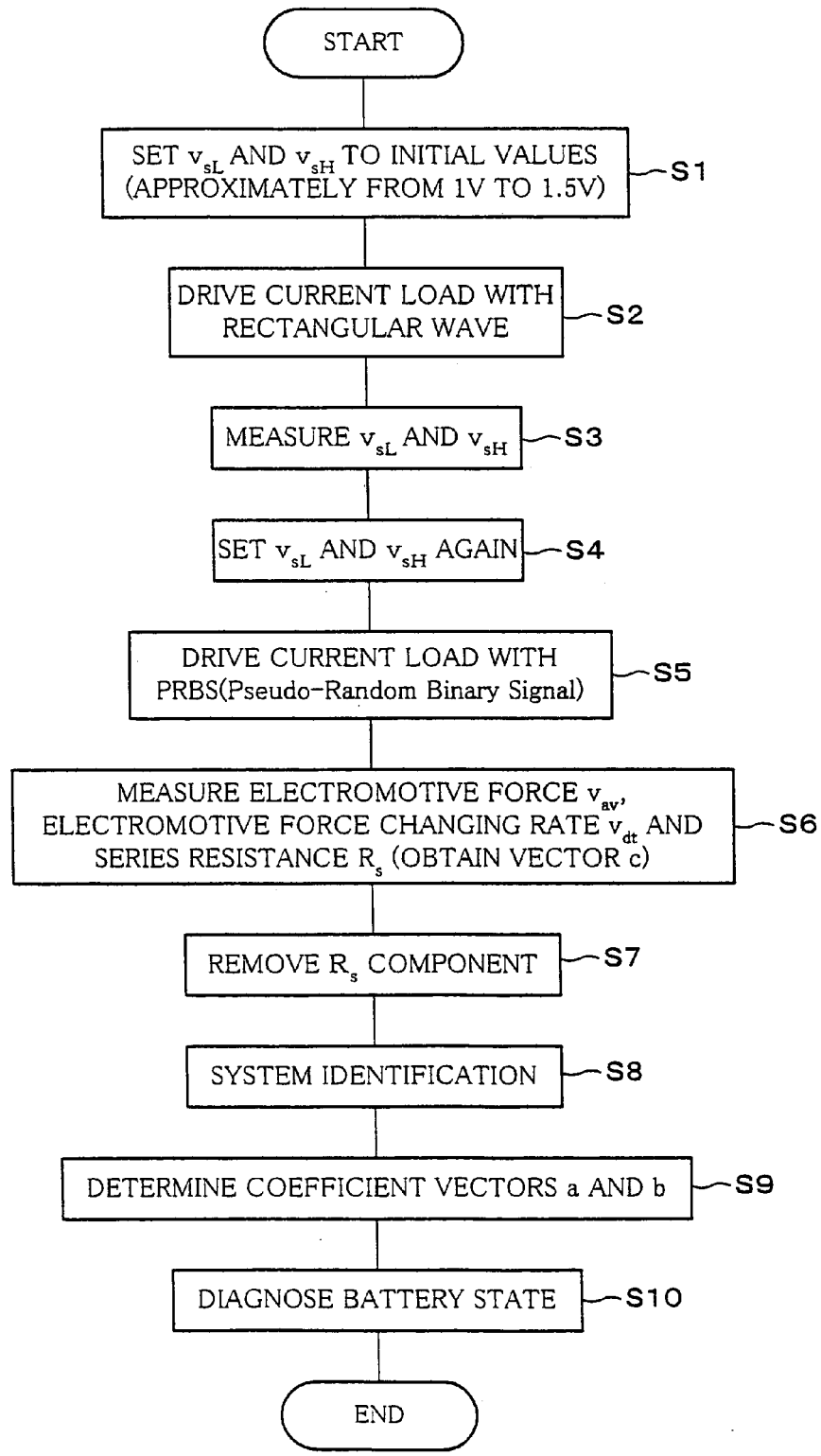
FIG. 7 is a flowchart showing diagnosing procedures in the battery state diagnosing device.

With reference to FIG. 7, the following describes a specific example of procedures for diagnosing the battery with the battery state diagnosing device.

First, because a state of the battery 10 is unknown, in the voltage level shift means 23 in FIG. 2, a range of $v_{sL}$ to $v_{sH}$ is set to an initial range of approximately 1 volt to 1.5 volts (S1). Next, the load applying section 12 is driven so as to supply a current load of a rectangular wave as shown in FIG. 3(a) to the battery 10 (S2). As a result, a response as shown in FIG. 3(b) is obtained. Based on the response so obtained, an optimal range of $v_{sL}$ to $v_{sH}$ is determined (S3), and this optimum range is set to $v_{sL}$ to $v_{sH}$ (S4).

Figure 8:
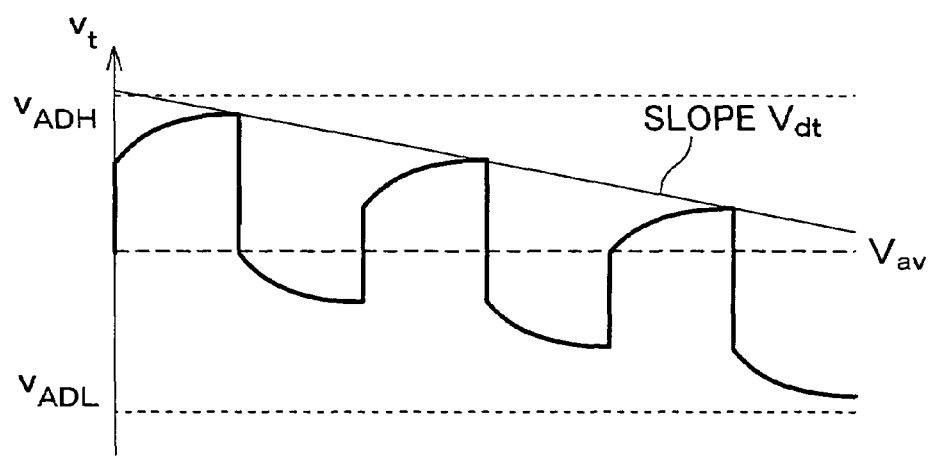
FIG. 8 is an output wave form chart showing a transient response of the battery when the current load is driven by a PRBS (Psudo-Random Binary Signal).

Then, the current load is driven by the PRBS (S5), so as to obtain a wave form including a transient response, as shown in FIG. 8. The $v_{ADH}$ and $v_{ADL}$ in FIG. 8 are the optimal values of $v_{sL}$ and $v_{sH}$, respectively. From the wave form of FIG. 8, the electromotive force $v_{av}$ and electromotive force changing rate $v_{dt}$ are calculated. Specifically, the electromotive force $v_{av}$ is calculated as an averaging value of the terminal voltage, as shown in FIG. 8. The electromotive force changing rate $v_{dt}$ is calculated as a slope of a straight line that connects perpendicular portions at the ends of voltage rises, as shown in FIG. 8.

Then, a portion of the electromotive force component ($v_{av}$, $v_{dt}$) is removed from the wave form of FIG. 8.

Figure 9:
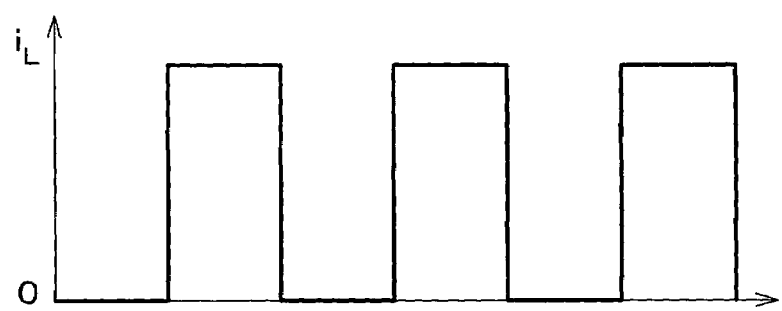
FIG. 9 is a voltage wave form chart showing the wave form of FIG. 8 after a measured electromotive force component ($v_{av}$, $v_{dt}$) has been removed.
Figure 9:
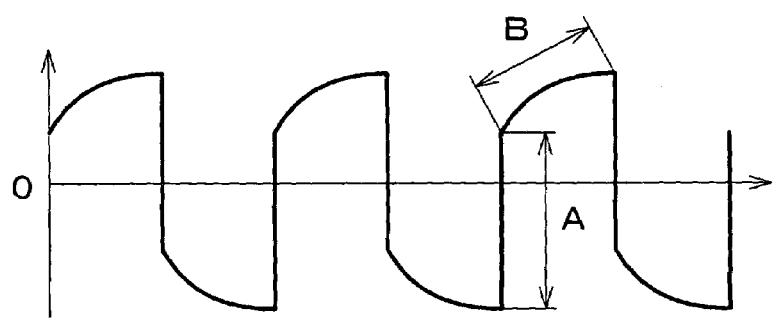

Thus, the wave form of FIG. 9 is obtained by expanding the voltage response shown in FIG. 8 and removing changes over time of the electromotive force. In FIG. 9, the portion of the wave form indicated by "A" (perpendicular portion) is a voltage response portion having no transient response due to the series resistance $R_s$. The portion of the wave form indicated by "B" in FIG. 9 is a voltage response portion where the transient response of Cp, Rp, Cn, and Rn is present (CR dynamics portion). From FIG. 9, $R_s$ can be calculated by dividing a voltage at the rise of the voltage pulse ("A" in FIG. 9) by a value of the input current $i_L$ at this instant. At this time, the vector c is obtained (S6).

Figure 10:
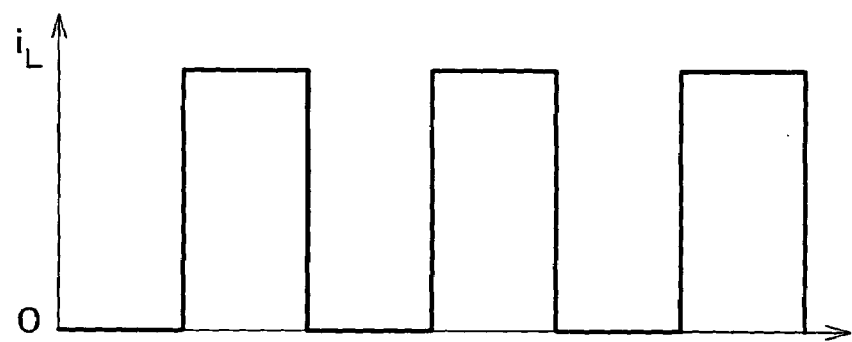
FIG. 10 is a voltage wave form chart showing the wave form of FIG. 9 after component A, which derives from $R_s$, has been removed and only component B has been extracted.
Figure 10:
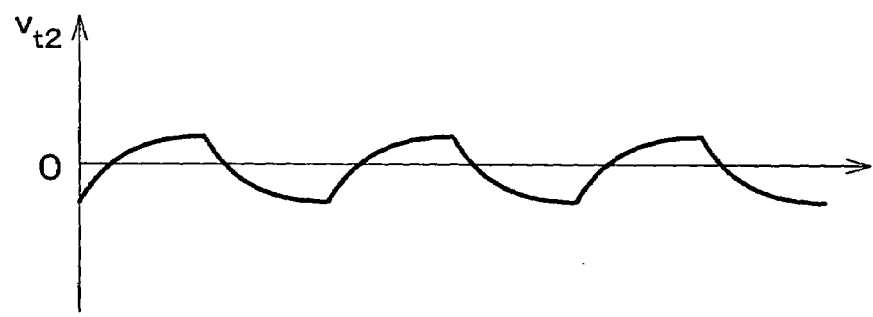

In order to remove the $R_s$-induced component A from the wave form of FIG. 9, only the portion B is extracted by subtracting a voltage equivalent to $R_s/i_L$ (S7). FIG. 10 shows the wave form after the portion B is extracted. Specifically, the wave form shown in FIG. 10 is a voltage wave form in which the electromotive force component ($v_{av}$, $v_{dt}$) has been removed from the actual response voltage wave form.

Employing the system identification method, a transfer function of only the transient response components is obtained, so as to determine a coefficient of each order (S8). As a result, the vectors a and b are obtained (S9). From these coefficient vectors, battery state diagnosing is performed (S10).

Figure 12:
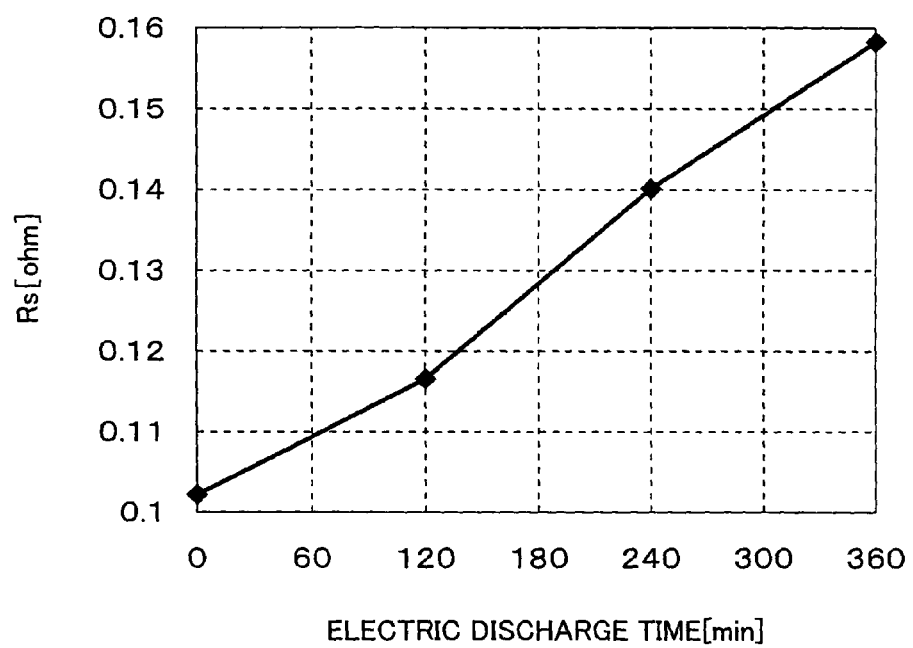
FIG. 12 is a graph showing an example of a result of diagnosis.
Figure 13:
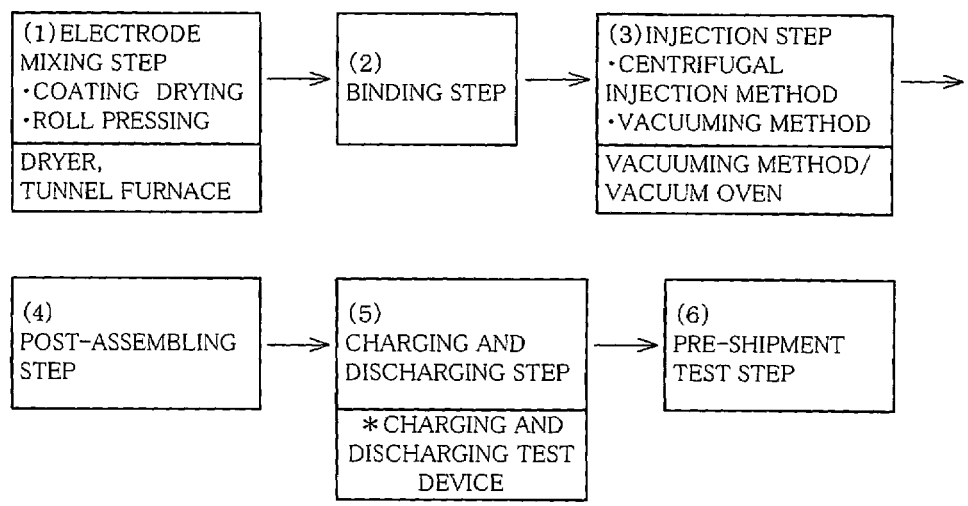
FIGS. 13(a) and 13(b) are charts showing an example of manufacturing steps for a lithium-ion battery.
Figure 13:
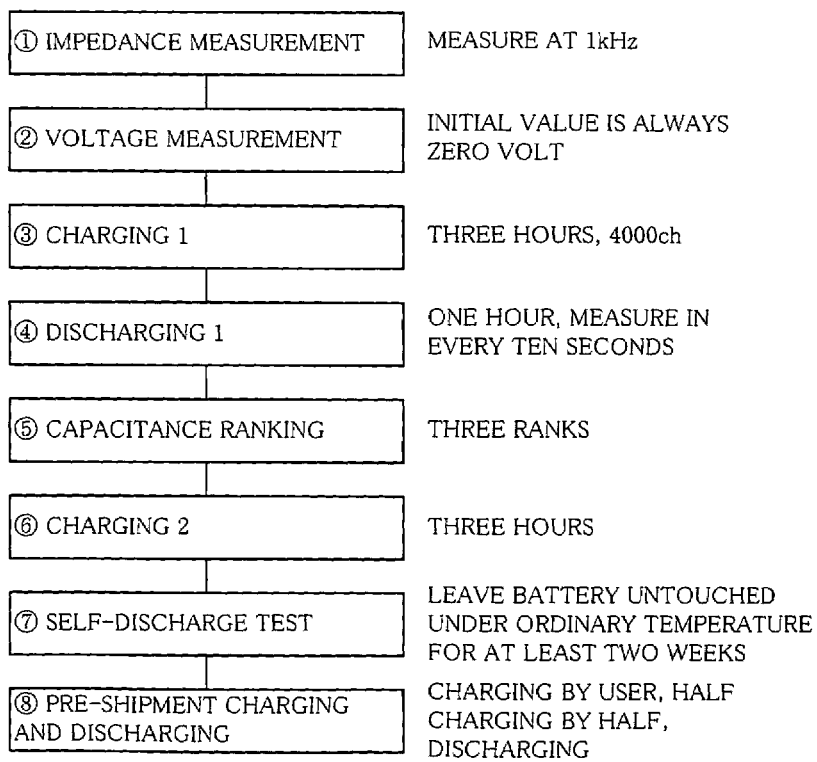

For example, when there is a clear correlation between $R_s$ and electric discharge time as shown in FIG. 12, by measuring the $R_s$ of the battery, it is possible to find the electric discharge time (that is, remaining capacity) of the battery by plugging the result of measurement into FIG. 12. The battery can also be diagnosed in terms of deterioration by a ratio of $R_s$ to Cp, Rp, or Rn, for example.

As described above, in the battery state diagnosing device of the present embodiment, it is no longer necessary to spend time for charging and discharging in testing a battery, for example, when making a diagnosis for the secondary battery.

In regard to the prediction of deterioration for example, a fuel cell of a fuel cell powered vehicle has its life as a matter of course. It is then possible to estimate how many years or how many kilometers the fuel cell will last by finding a state of deterioration. This can be done by regularly measuring the output of the battery as described above, and by finding individual and overall tendencies of coefficient change from $a_{1t0} \rightarrow a_{1tm}, \ldots, a_{nt0} \rightarrow a_{ntm}, b_{1t0} \rightarrow b_{1tm}, \ldots, b_{mt0} \rightarrow b_{mtm}, v_{rs0} \rightarrow v_{rsm}, v_{dt0} \rightarrow v_{dtm}$, and $R_{s0} \rightarrow R_{sm}$.

Moreover, initial coefficient vectors $a_{t0}$, $b_{t0}$, and $c_{t0}$ may be attached to the fuel cell powered vehicle as automobile inspection data and shipped with the fuel cell powered vehicle. A fuel cell of each automobile may be labeled with its own management number, so that its history can be managed and followed. This leads to improved services for users.

As described above, in the battery state diagnosing device of the present invention, the load current is used as the load applying section 12 that is serially connected to the battery in the closed circuit 15. In this way, it is possible to solve the problem of direct current path caused in the arrangement that uses the load voltage as in Tokukaihei 10-232273.

In order to identify an internal impedance of a battery, it is necessary to measure a terminal voltage and a current of the battery. In the method where the voltage load and the impedance element are used as the load for the battery as in Tokukaihei 10-232273, the current i in the circuit is given by $$i = \frac{Vx + Vb}{Zx + Zb}$$

where Vx is the load voltage, Vb is the internal electromotive force of the battery, and Zb is the internal impedance.

This is where the problem of direct current path is caused, whereby Vx needs to be finely adjusted in accordance with a change of the internal electromotive force Vb in order to adjust the current to have a predetermined value. The problem of direct current path can then be prevented if the load voltage and load impedance are eliminated using the current load as in the battery state diagnosing device of the present embodiment. As a result, it is possible to easily identify the internal impedance of the battery from the result of measurement.

In the battery state diagnosing device, the measured output is the terminal voltage of the battery. In making diagnosis by the system identification method, the component of the terminal voltage that derives from the electromotive force of the battery is regarded as a bias and is removed. A slight voltage fluctuation after removing the electromotive component of the terminal voltage is amplified and used in making diagnosis by the system identification method.

In making measurement, a full scale of measuring equipment should be effectively used in order to improve the accuracy of the measurement. Especially, in digital measurement where the problem of resolution is present, S/N ratio can be improved by processing the signal in accordance with an input voltage of an A/D converter. A battery voltage is an output given by (direct current electromotive force)+(relatively small voltage fluctuation with respect to the direct current electromotive force).

Therefore, removing and processing the voltage fluctuation makes it possible to perform accurate measurement. The direct current electromotive force varies depending on the type or state of the battery. By measuring an approximate value of the direct current electromotive force (electromotive force component) and removing it from the fluctuating terminal voltage as a bias, it is possible to use only the voltage fluctuation component in the diagnosis by the system identification method. The accuracy of measurement can be improved by amplifying the voltage fluctuation in accordance with an input scale of the A/D converter, using an automatic gain amplifier or the like.

In applying the system identification method employed in the battery state diagnosing device to a fuel cell such as PEFC, DMFC, or the like, deterioration of an electrolyte can be diagnosed by performing the system identification without activating the fuel cell. Specifically, the foregoing method can be used to measure deterioration of the battery even when the fuel cell behaves differently when fuel is supplied thereto and when fuel is not supplied thereto, because, even when no fuel is supplied, only the electromotive force is absent and the electrolyte and the impedance of an electrode can still be measured. In this case, it is preferable that the measurement be performed by serially connecting a voltage source of approximately 1.2V to the current load.

In the descriptions above, it is assumed that the battery 10, for which the diagnosis is made, is a secondary battery (that is, a battery that generates an electromotive force). On this assumption, the current load is used as the load applying section 12.

However, in the present invention, a voltage source may be used as the load applying section 12 when diagnosis is to be made for a fuel cell that is not supplied with fuel (that is, a battery that generates no electromotive force). In this case, because no electromotive force is generated in the fuel cell (battery 10), the problem of direct current path, which may be caused in the diagnosis of a secondary battery, does not occur even if the fuel cell is driven by the voltage source. Therefore, for the fuel cell that is not supplied with fuel, diagnosis may be carried out using the voltage source, which is easier to realize. However, for the fuel cell that is supplied with fuel, it is preferable that diagnosis be made using the current load for the load applying section 12 in the battery state diagnosing device, because in this case the fuel cell generates the electromotive force as in the case of a secondary battery.

As described above, the battery state diagnosing device of the present embodiment is a battery state diagnosing device for applying load to a battery, measuring input and output characteristics of the battery, and diagnosing a state of the battery by plugging a result of measurement into a mathematical expression obtained by a system identification method, the battery state diagnosing device applying load to the battery using a current load.

In the battery state diagnosing device for diagnosing a battery state by the system identification method, it is necessary to measure the terminal voltage and current of the battery so as to identify the internal impedance of the battery. In a conventional arrangement where a voltage load is used for the measurement, an impedance element is serially connected to the battery because the battery in this case is an internal equivalent circuit including an electromotive force and a low series impedance. Therefore, the measured current or a mathematical expression representing it includes a load voltage due to the impedance element, in addition to the load impedance. This causes the problem of direct current path, whereby the load voltage needs to be finely adjusted in accordance with changes in internal electromotive force of the battery in order to adjust the current to a predetermined value.

In contrast, according to the arrangement above, the problem of direct current path is avoided, making it easier to identify the internal impedance of the battery from the measured current. This is achieved by applying current load to the battery, so that the load voltage and load impedance do not appear in the measured current or a mathematical expression representing the measured current.

In the battery state diagnosing device, the measured output characteristic is a terminal voltage of the battery, and when diagnosing the battery by system identification, an electromotive force component of a fluctuating terminal voltage of the battery is removed as a bias, and a slight voltage fluctuation after the electromotive force component has been removed is amplified and used for the diagnosis by the system identification.

In making measurement, a full scale of measuring equipment should be effectively used in order to improve the accuracy of the measurement. Especially, in digital measurement where the problem of resolution is present, the S/N ratio can be improved by processing the signal in accordance with the input voltage of the A/D converter. The battery voltage is an output given by (direct current electromotive force)+(relatively small voltage fluctuation with respect to the direct current electromotive force).

Therefore, removing and processing the voltage fluctuation makes it possible to perform accurate measurement. The direct current electromotive force varies depending on the type or state of the battery.

With the arrangement above, by measuring an approximate value of the direct current electromotive force (electromotive force component) and removing it from the fluctuating terminal voltage as a bias, it is possible to use only the voltage fluctuation component in the diagnosis by the system identification method. The accuracy of measurement can be improved by amplifying the voltage fluctuation, using an automatic gain amplifier or the like, in accordance with an input scale of the A/D converter.

In the battery state diagnosing device, the measured output characteristic is a terminal voltage of the battery; and when diagnosing the battery by system identification, a fluctuating terminal voltage of the battery is separated into a perpendicular component which derives from a serial resistance of the battery, and a component representing CR dynamics; the perpendicular component is removed from the terminal voltage; and a slight voltage fluctuation after the perpendicular component has been removed is amplified and used for the diagnosis by the system identification.

The response wave form of the battery includes a perpendicular portion, which derives from the serial resistance of the battery, and a portion representing CR dynamics. Because the CR dynamics portion is relatively smaller than the perpendicular portion, accuracy of identification is improved by separately identifying these portions. In addition, in the case where an identified wave form includes the perpendicular portion, the perpendicular portion under certain measurement conditions may be recognized not as a perpendicular portion but as a portion of a transient response with a markedly small time constant (as in the case where the rise of the wave form is gradual, for example).

In contrast, with the arrangement above, it is possible to improve the accuracy of identification by separating the perpendicular portion and the CR dynamics portion from each other, and performing the system identification utilizing only the CR dynamics portion.

In the battery state diagnosing device, in order to remove the perpendicular component from the terminal voltage, a voltage value at a rise of a voltage pulse representing the electromotive force component of the battery is calculated from a voltage wave form of the terminal voltage, and the calculated value of the voltage pulse is subtracted from the terminal voltage.

With the arrangement above, it is possible to separate, by automatic calculation, unnecessary portions of the wave form, such as a bias (perpendicular component), of the terminal voltage to be identified.

Another battery state diagnosing device of the present embodiment is a battery state diagnosing device for applying a current to a battery, measuring input and output characteristics of the battery, and diagnosing a state of the battery by plugging a result of measurement into a mathematical expression obtained by a system identification method, the battery being a fuel cell that is not supplied with fuel, and the battery being supplied with current from a voltage source.

With this arrangement, in applying the system identification method employed in the battery state diagnosing device to a fuel cell such as PEFC, DMFC, or the like, deterioration of an electrolyte can be diagnosed by performing the system identification without activating the fuel cell. Specifically, the foregoing method can be used to measure deterioration of the battery even when the fuel cell behaves differently when fuel is supplied thereto and when fuel is not supplied thereto, because, even when no fuel is supplied, only the electromotive force is absent and the electrolyte and the impedance of an electrode can still be measured.

In the diagnosis of a fuel cell that is not supplied with fuel, as described above, the problem of direct current path does not occur even if a voltage source is used, because in this case no electromotive force is generated in the fuel cell. Therefore, for a fuel cell that is not supplied with fuel, it is preferable to make diagnosis using a voltage source, which is easier to realize.

Yet another battery state diagnosing device of the present embodiment is a battery state diagnosing device for applying load to a battery, measuring input and output characteristics of the battery, and diagnosing a state of the battery by plugging a result of measurement into a mathematical expression obtained by a system identification method, said battery state diagnosing device including: a circuit section for constituting a closed circuit by serially connecting the battery to a current load when diagnosing the battery; a measuring section, connected to the circuit section, for measuring a terminal voltage of the battery and a current flowing in the circuit section; and a diagnosing section for diagnosing, by the system identification method, a state of the battery based on a result of measurement by the measuring section.

In this arrangement, the measuring section measures the terminal voltage and current of the battery while the current load is connected to the battery in the circuit section. In this way, the load voltage and load impedance do not appear in the measured current or a mathematical expression representing the measured current. As a result, the problem of direct current path is avoided, making it easier to identify the internal impedance of the battery from the measured current.

Still another battery state diagnosing device of the present embodiment is a battery state diagnosing device for applying a current to a battery, measuring input and output characteristics of the battery, and diagnosing a state of the battery by plugging a result of measurement into a mathematical expression obtained by a system identification method, the battery being a fuel cell that is not supplied with fuel, said battery state diagnosing device including: a circuit section for constituting a closed circuit by serially connecting the battery to a voltage source when diagnosing the battery; a measuring section, connected to the circuit section, for measuring a terminal voltage of the battery and a current flowing in the circuit section; and a diagnosing section for diagnosing, by the system identification method, a state of the battery based on a result of measurement by the measuring section.

In this arrangement, the measuring section measures the terminal voltage and current of the battery while the voltage source is connected to the battery in the circuit section. Here, when the battery is a fuel cell that is not supplied with fuel, the use of voltage source to apply current to the battery does not cause the problem of direct current path because in this case no electromotive force is generated in the fuel cell. Therefore, for a fuel cell that is not supplied with fuel, it is preferable to make diagnosis using a voltage source, which is easier to realize.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A battery state diagnosing device comprising:
a load applying section applying a load to a battery;
a measuring section measuring input and output characteristics of the battery in response to the applied load; and
a diagnosing section diagnosing a state of the battery by applying a transient result obtained from the measurement to a mathematical expression obtained by a system identification method, wherein
said battery state diagnosing device applies the load to the battery as a current load.

2. A battery state diagnosing device comprising:
a load applying section applying a current to a battery, a measuring section measuring input and output characteristics of the battery in response to the applied load, and
a diagnosing section diagnosing a state of the battery by applying a result of the measurement to a mathematical expression obtained by a system identification method, wherein
the load applying section applies a current to the battery when the battery is not supplied with fuel.

3. A battery state diagnosing device for applying load to a battery, measuring input and output characteristics of the battery, and diagnosing a state of the battery by applying a result of the measurement to a mathematical expression obtained by a system identification method, said battery state diagnosing device comprising:
a circuit section for constituting a closed circuit by serially connecting the battery to a current load when diagnosing the battery;
a measuring section, connected to the circuit section, for measuring a terminal voltage of the battery and a current flowing in the circuit section; and
a diagnosing section for diagnosing, by the system identification method, a state of the battery based on a transient result obtained from the measurement by the measuring section.

4. A battery state diagnosing device for applying a current to a battery, measuring input and output characteristics of the battery, and diagnosing a state of the battery by applying a result of the measurement to a mathematical expression obtained by a system identification method, the battery being a fuel cell that is not supplied with fuel,
said battery state diagnosing device comprising:
a circuit section for constituting a closed circuit by serially connecting the battery to a voltage source when diagnosing the battery;
a measuring section, connected to the circuit section, for measuring a terminal voltage of the battery and a current flowing in the circuit section; and
a diagnosing section for diagnosing, by the system identification method, a state of the battery based on a result of the measurement by the measuring section.

5. A battery state diagnosing method comprising the steps of:
applying a load to a battery;
measuring input and output characteristics of the battery in response to the applied load;
diagnosing a state of the battery by applying a transient result obtained from the measurement to a mathematical expression obtained by a system identification method; and
outputting the state of the battery diagnosed in the diagnosing step, wherein
said step of applying a load to the battery serially connects the battery to a current load.

6. A battery state diagnosing method comprising the steps of:
applying a current to a battery,
measuring input and output characteristics of the battery in response to the applied current,
diagnosing a state of the battery by applying a result of the measurement to a mathematical expression obtained by a system identification method; and
outputting the state of the battery diagnosed in the diagnosing step, wherein
the current is applied to the battery when the battery is not supplied with fuel, and
said step of applying a current serially connects the battery to a voltage source.

7. A battery state diagnosing device comprising:
a load applying section applying a load to a battery;
a measuring section measuring input and output characteristics of the battery in response to the applied load; and
a diagnosing section diagnosing a state of the battery by applying a result of the measurement to a mathematical expression obtained by a system identification method, wherein
said battery state diagnosing device applies the load to the battery as a current load;
the measured output characteristic is a terminal voltage of the battery; and
when diagnosing the battery by system identification, an electromotive force component of a fluctuating terminal voltage of the battery is removed as a bias, and a voltage fluctuation after the electromotive force component has been removed is amplified and used for the diagnosis by the system identification.

8. A battery state diagnosing device comprising:
a load applying section applying a load to a battery;
a measuring section measuring input and output characteristics of the battery in response to the applied load; and
a diagnosing section diagnosing a state of the battery by applying a result of the measurement to a mathematical expression obtained by a system identification method, wherein
said battery state diagnosing device applies the load to the battery as a current load;
the measured output characteristic is a terminal voltage of the battery; and
when diagnosing the battery by a system identification, a fluctuating terminal voltage of the battery is separated into a perpendicular component which derives from a serial resistance of the battery, and a component representing Capacitance-Resistance dynamics;
the perpendicular component is removed from the terminal voltage; and a voltage fluctuation after the perpendicular component has been removed is amplified and used for the diagnosis by the system identification.

9. The battery state diagnosing device as set forth in claim 8, wherein:
in order to remove the perpendicular component from the terminal voltage, a voltage value at a rise of a voltage pulse representing the electromotive force component of the battery is calculated from a voltage wave form of the terminal voltage, and the calculated value of the voltage pulse is subtracted from the terminal voltage.

10. A battery state diagnosing method comprising the steps of:
applying a load to a battery;
measuring input and output characteristics of the battery in response to the applied load;
diagnosing a state of the battery by applying a result of the measurement to a mathematical expression obtained by a system identification method; and
outputting the state of the battery diagnosed in the diagnosing step, wherein
said step of applying a load to the battery serially connects the battery to a current load;
the measured output characteristic is a terminal voltage of the battery; and
when diagnosing the battery by system identification, an electromotive force component of a fluctuating terminal voltage of the battery is removed as a bias, and a voltage fluctuation after the electromotive force component has been removed is amplified and used for the diagnosis by the system identification.

11. A battery state diagnosing method comprising the steps of:
applying a load to a battery;
measuring input and output characteristics of the battery in response to the applied load;
diagnosing a state of the battery by applying a result of the measurement to a mathematical expression obtained by a system identification method; and
outputting the state of the battery diagnosed in the diagnosing step, wherein
said step of applying a load to the battery serially connects the battery to a current load;
the measured output characteristic is a terminal voltage of the battery; and
when diagnosing the battery by a system identification, a fluctuating terminal voltage of the battery is separated into a perpendicular component which derives from a serial resistance of the battery, and a component representing Capacitance-Resistance dynamics;
the perpendicular component is removed from the terminal voltage and
a voltage fluctuation after the perpendicular component has been removed is amplified and used for the diagnosis by the system identification.

12. The battery state diagnosing method as set forth in claim 11, wherein:
in order to remove the perpendicular component from the terminal voltage, a voltage value at a rise of a voltage pulse representing the electromotive force component of the battery is calculated from a voltage wave form of the terminal voltage, and the calculated value of the voltage pulse is subtracted from the terminal voltage.

13. A battery state diagnosing device comprising:
a load applying section applying a load to a battery;
a measuring section measuring input and output characteristics of the battery in response to the applied load; and a diagnosing section diagnosing a state of the battery by applying a transient result obtained from the measurement to a mathematical expression obtained by a system identification method, wherein said battery state diagnosing device applies the load to the battery as a current load, wherein the measured output characteristic is a terminal voltage of the battery; and the diagnosing section removes an electromotive force component of a fluctuating terminal voltage of the battery to obtain the transient result, and amplifies this transient result for diagnosis by the system identification.

14. A battery state diagnosing device comprising:

a load applying section applying a load to a battery;

a measuring section measuring input and output characteristics of the battery in response to the applied load; and a diagnosing section diagnosing a state of the battery by applying a transient result obtained from the measurement to a mathematical expression obtained by a system identification method, wherein said battery state diagnosing device applies the load to the battery as a current load, wherein the measured output characteristic is a terminal voltage of the battery; and the diagnosing section is operable to;

separate a fluctuating terminal voltage of the battery into a perpendicular component which derives from a serial resistance of the battery, and a component representing Capacitance-Resistance dynamics;

remove the perpendicular component from the terminal voltage to obtain the transient result; and amplify the transient result obtained after the perpendicular component has been removed for diagnosis by the system identification.

* * * * *